(12) United States Patent
Saeki

(10) Patent No.: US 7,179,520 B2
(45) Date of Patent: Feb. 20, 2007

(54) CIRCUIT SUBSTRATE, ELECTRO-OPTIC DEVICE AND ELECTRONIC EQUIPMENT

(75) Inventor: Takayuki Saeki, Okayama-ken (JP)

(73) Assignee: Seiko Epson Corporation, Tokyo (JP)

( * ) Notice: Subject to any disclaimer, the term of this patent is extended or adjusted under 35 U.S.C. 154(b) by 83 days.

(21) Appl. No.: 11/019,639

(22) Filed: Dec. 23, 2004

(65) Prior Publication Data

US 2005/0161832 A1  Jul. 28, 2005

(30) Foreign Application Priority Data

Dec. 26, 2003 (JP) ............................. 2003-433388

(51) Int. Cl.
*B32B 9/00* (2006.01)
*H01K 1/03* (2006.01)

(52) U.S. Cl. ............ 428/209; 174/254; 174/255; 428/901; 361/749

(58) Field of Classification Search ........ 174/254–255; 428/209, 901; 361/749
See application file for complete search history.

(56) References Cited

U.S. PATENT DOCUMENTS

| 3,378,920 | A | * | 4/1968 | Cone .................... 29/847 |
| 3,499,098 | A | * | 3/1970 | McGahey et al. .......... 174/261 |
| 3,525,617 | A | * | 8/1970 | Bingham ............... 430/312 |
| 3,535,780 | A | * | 10/1970 | Berger ................... 29/837 |
| 4,224,395 | A | * | 9/1980 | Wiedemann ............. 430/58.5 |
| 4,899,439 | A | * | 2/1990 | Potter et al. ............ 29/846 |
| 5,250,758 | A | * | 10/1993 | Fjelstad et al. ........... 174/254 |
| 5,274,195 | A | * | 12/1993 | Murphy et al. ....... 174/117 FF |
| 5,300,619 | A | * | 4/1994 | Okada et al. ............ 528/170 |
| 5,438,166 | A | * | 8/1995 | Carey et al. ............ 174/261 |
| 5,440,193 | A | * | 8/1995 | Barrett ................ 310/328 |
| 6,204,559 | B1 | * | 3/2001 | Lin et al. .............. 257/738 |
| 6,469,261 | B2 | * | 10/2002 | Yamanashi et al. ........ 174/268 |

FOREIGN PATENT DOCUMENTS

| JP | 10-125931 | 5/1998 |
| JP | 11-272205 | 10/1999 |
| JP | 2002-328625 | 11/2002 |

\* cited by examiner

*Primary Examiner*—Cathy F. Lam
(74) *Attorney, Agent, or Firm*—Oliff & Berridge, PLC

(57) ABSTRACT

A circuit substrate is described where the circuit substrate has a first wiring group extending in a first direction and a second wiring group extending in a second direction substantially orthogonal to the first direction. The first wiring group of the circuit substrate is stronger than the second wiring group, and the second wiring group bends more easily than the first wiring group, which results in directional flexibility of said circuit substrate.

19 Claims, 5 Drawing Sheets

L1 FIRST WIRING GROUP
MATERIAL 1
(MODULUS OF LONGITUDINAL ELASTICITY E1)

L2 SECOND WIRING GROUP
MATERIAL 2
(MODULUS OF LONGITUDINAL ELASTICITY E2)

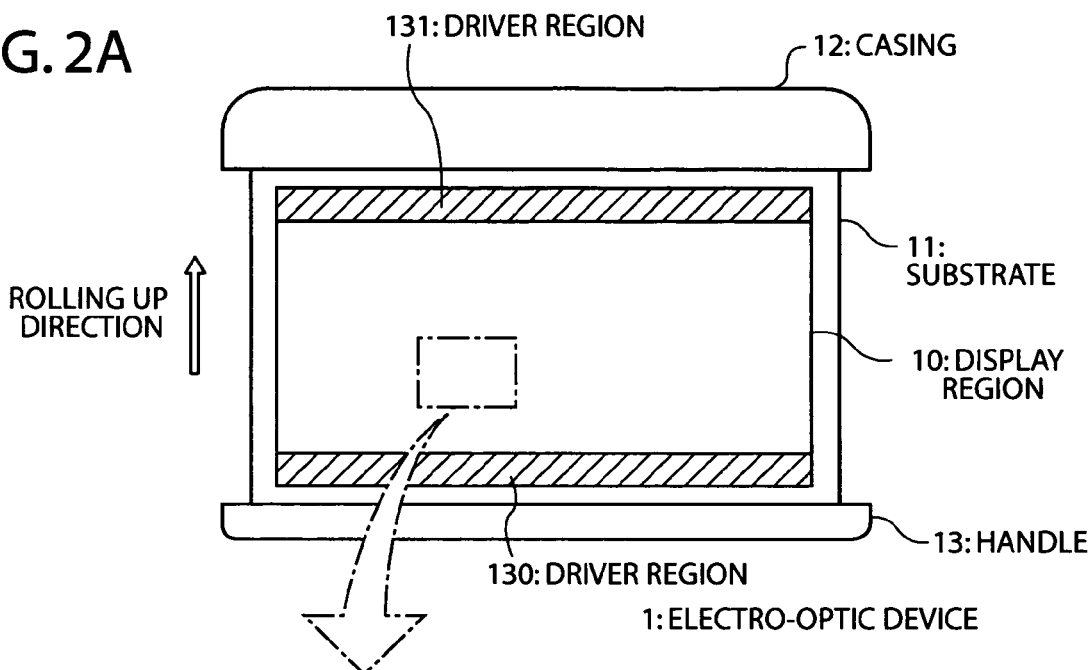
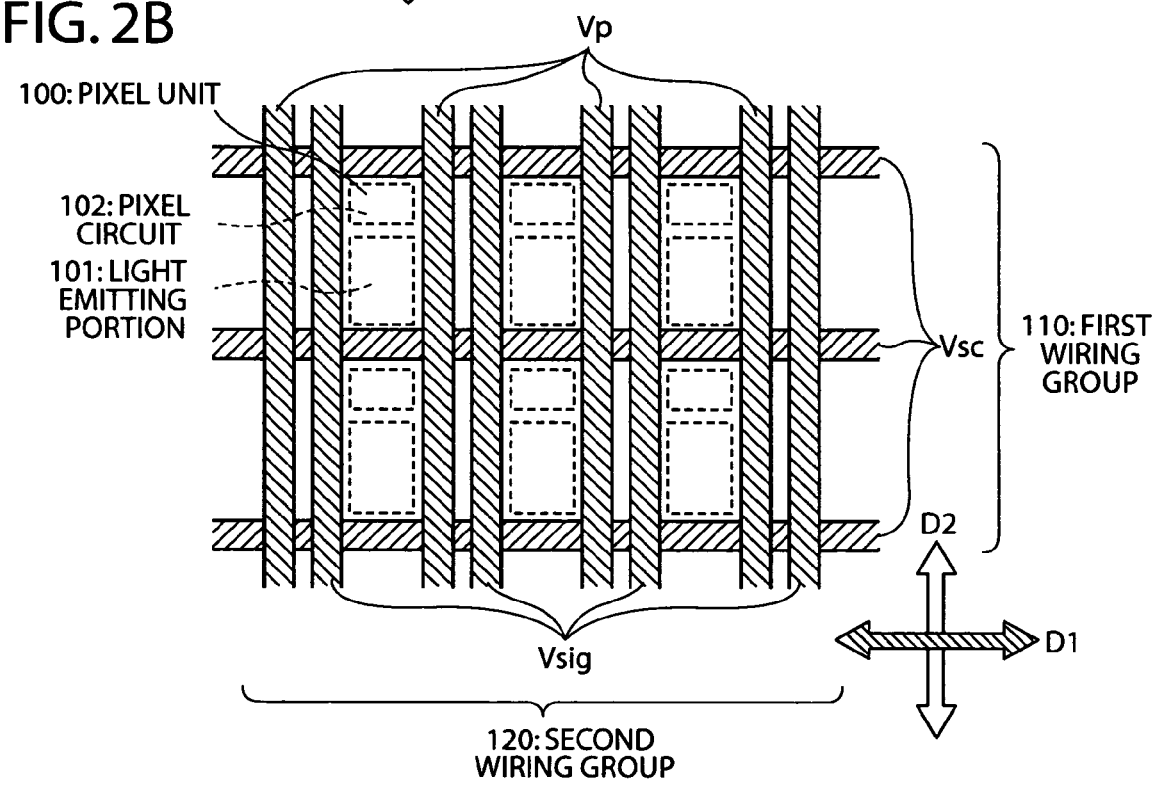

CIRCUIT SUBSTRATE, ELECTRO-OPTIC
DEVICE AND ELECTRONIC EQUIPMENT

RELATED APPLICATION INFORMATION

This application claims priority to Japanese Application No. 2003-433388, filed Dec. 26, 2003, whose contents are expressly incorporated herein by reference.

FIELD OF THE INVENTION

Aspects of the present invention relate to a flexible circuit substrate. More particularly, aspects of the present invention relate to a circuit substrate structured so as to be easily bendable in a given direction.

DESCRIPTION OF RELATED ART

Display devices formed on a flexible substrate are capable of being rolled up and stored. For example, Japanese Unexamined Patent Publication No. 2002-328625 describes a display device having a screen type display portion capable of being rolled up and stored. Here, the display device includes a drive means at one end thereof that provides this function. Also, Japanese Unexamined Patent Publication No. H11-272205 describes a display device having a display region composed of pixels arranged in a matrix form. The display device is flexible in that it includes both a flat region and flexion region and uses the flat region as part of the display. By use of the above techniques, flexible substrates having a display region may be rolled (in a predefined direction) and stored.

However, in conventional display devices, the flexible substrates may be subject to variable directions of flexibility (such that in some situations, the direction of flexibility may curve). Accordingly, these devices may be difficult to roll. In particular, as the substrate area increases, the chance for the substrate bending in a direction different from a desired rolling direction increases, and undesired bending occurs. The undesired bending makes it difficult to quickly and easily roll up the flexible substrate in the desired direction.

Moreover, if wiring in the substrate is parallel to the rolling direction and lacks elasticity, large stresses may be applied to the wiring when the substrate is rolled. These stresses may lead to an increased possibility of breaking or deterioration of the wiring.

An improved substrate is needed that rolls easily in a first direction yet resists bending in other directions.

BRIEF SUMMARY OF THE INVENTION

Aspects of the present invention relate to forming a circuit substrate with different wiring groups that have different levels of flexibility. The direction of flexibility may be controlled through controlling the relative flexibility of the wiring groups.

BRIEF DESCRIPTION OF THE DRAWINGS

Aspects of the present invention are illustrated by way of example and not limited in the accompanying figures in which like reference numerals indicate similar elements.

FIG. 1 is an explanatory view of a circuit substrate according to aspects of the present invention, wherein

FIG. 2 is a block diagram of an electro-optic device of an embodiment having a circuit substrate according to aspects of the present invention, wherein FIG. 2a is a plan view, and FIG. 2b is a partial enlarged view.

DETAILED DESCRIPTION

Figure 1A:
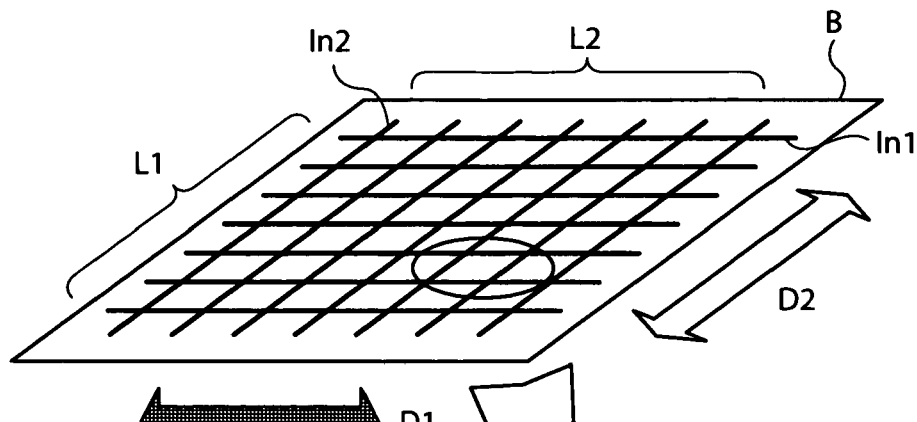
FIG. 1a is a perspective view.

Aspects of the present invention are described with reference to the various drawings.

Aspects of the present invention relate to rolling up or bending a substrate in a predetermined direction. The predetermined direction relates to a direction in which the rolling of a substrate based on features of the substrate, where the elements on the substrate promote the rolling of the substrate in one direction over another.

It is noted that various connections are set forth between elements in the following description. It is noted that these connections in general and, unless specified otherwise, may be direct or indirect and that this specification is not intended to be limiting in this respect.

Overview of Aspects of the Invention

In the various aspects of the present invention, a circuit substrate may include a first wiring group extending in a first direction and a second wiring group extending in a second direction, which may be substantially orthogonal to the first direction. The first wiring group may be formed so as to be harder than the second wiring group. The second wiring group may bend more readily than the first wiring group, thereby forming a circuit substrate that has at least some level of flexibility in one direction.

In at least one aspect of the present invention, since the first wiring group is more rigid than the second wiring group, the second wiring group as a whole may bend to a greater degree than the first wiring group. In this regard, the circuit substrate becomes the structure that bends easily across the second wiring group and becomes the circuit substrate that bends easily in a predetermined direction.

Therefore, by keeping the second direction (the direction of the second wiring group) substantially parallel with the rolling up direction, the circuit substrate bends easily when rolling up. Likewise, attempting to roll up the circuit substrate in a direction not in the second direction is difficult. By rolling up the circuit substrate in the predetermined (second) direction, the rolling process is performed rapidly and easily.

Moreover, since the second wiring group is not as rigid as the first wiring group, the stress when the substrate has been rolled up is minimized. Because of the reduced stress, the reliability of a rolled up substrate may be increased and the operable life of the circuit substrate increased.

Terms

The following lists various terms used herein.

Hardness—Hardness may be defined as a material's relative resistance to denting, scratching, or bending. Hardness may be determined relatively by the magnitude of individual values of several physical conditions.

For example, by forming the first wiring group with a material having a larger modulus of elasticity than a material constituting the second wiring group, the first wiring group can be physically harder than the second wiring group. In the case where the material forming each wiring group is different in the first wiring group and the second wiring group in the presence of other conditions (such as the wiring structure are the same), the difference in flexibility of the both wirings may be determined by the difference in elasticity of the material. Also, the second wiring group may have a smaller modulus of elasticity, thereby making it easier to bend.

As used herein, the terms 'harder' and 'stronger' are used. 'Harder' relates to an intrinsic property of a material. 'Stronger' relates to a strength of the material. In some instances, the terms may be used interchangeably.

Modulus of Elasticity—Modulus of Elasticity generally refers to a measure of the elastic force of any substance, expressed by the ratio of a stress on a given unit of the substance to the accompanying distortion, or strain. As applied to the wiring groups described herein, the Modulus of Elasticity relates to a modulus of longitudinal elasticity of the extending direction of the wiring. Moreover, for example, by forming the width of each wiring of the first wiring group wider than the width of each wiring of the second wiring group, the first wiring group can be made harder than the second wiring group. Where the width of each wiring is different in the first wiring group and the second wiring group, and the other conditions (such as the material of the wiring, or the height of the wiring) are the same, the difference of the flexibility of both wiring groups may be determined by the difference of the widths of the first and second wiring groups. Specifically, the second wiring group having a narrower width becomes easier to bend.

Moreover, for example, by forming the thickness of each wiring of the first wiring group thicker than the thickness of each wiring of the second wiring group, the first wiring group may be harder than the second wiring group. Where the height of each wiring is different in the first wiring group and the second wiring group, and other conditions (such as the material of the wiring, or the width of the wiring) are the same, the difference in the flexibility of both wiring groups is determined by the difference of the heights or widths of the wiring groups. Here, the second wiring group having a narrower width may be easier to bend.

Further, for example, a circuit substrate including a first wiring group extending in a first direction and a second wiring group extending in a second direction substantially orthogonal to the first direction, wherein the number of the wirings of the first wiring group is more than the number of the wirings of the second wiring group, bends more easily across the second wiring group, thereby contributing to the circuit substrate being flexible in at least one direction as opposed to another. Where the number of the wirings is different between the first wiring group and the second wiring group, and the other conditions (such as the material of the wiring, or the width and the height of the wiring) are the same, the difference of the flexibility between both wiring groups is determined by the difference of the number of the wirings. The second wiring group having fewer numbers of the wirings may be easier to bend.

Relative hardness—Relative hardness of a wiring group may be determined also by the combination of several physical conditions. That is, in some aspects of the present invention, a circuit substrate comprising a first wiring group extending in a first direction and a second wiring group extending in a second direction substantially orthogonal to the first direction, wherein, as for the first wiring group and the second wiring group, by changing a plurality of elements selected from a group of at least one of the modulus of elasticity of the constituent material, the width of individual wiring, the thickness of individual wiring, and the number of the wirings constituting each wiring group, the first wiring group may be relatively harder than the second wiring group. Here, the second wiring group may bend more readily (and/or more extensively) than the first wiring group, therefore contributing to the circuit substrate being flexible as a whole.

The flexibility of the structure changes respectively depending on the modulus of elasticity of the material forming the structure, the width, the height and the number wirings in the structure. Therefore, by differentiating this plurality of physical quantities between the first wiring group and the second wiring group, the flexibility of the second wiring group can be increased relative to the flexibility of the first wiring group. Thus, the second wiring group, which has a smaller hardness, is easier to bend.

Aspects of the present invention include an electro-optic device including the circuit substrate of the present invention as described above (as well as being considered as electronic equipment). Such a circuit substrate has a characteristic of being easier to bend and easier to roll up in a certain direction. Therefore, for example, by applying to an electro-optic device and electronic equipment capable of rolling up and storing, it is possible to provide a highly reliable product that is easy to store and yields less stress to the wiring of the device and associated equipment while in the stored state.

Electro-optic Device—An "electro-optic device" generally refers to a device having an electro-optic element that emits light by the electronic action or changes the state of light from the outside. The term "electro-optic device" includes but is not limited to a device that emits light itself and a device that controls the passing of light supplied from outside the device. For example, an electro-optic element may include a display device or the like of an active matrix-type having a liquid crystal element, an electrophoretic element, an EL (electro luminescence) element, an electron emission element (that exposures the electron generated by applying electric field to the light emitting plate to emit light), or the like.

Electronic Equipment—"Electronic equipment" relates to a general apparatus that gives a certain function by combining a plurality of elements or circuits. For example, electronic equipment may include both an electro-optic device and a memory. The term electronic equipment is not limited; however, when using the circuit substrate of the present invention, substrate is particularly suitable for electronic equipment that may be physically reduced to a smaller size (for example, rolling up and the like). For instance, the following lists electronic equipment that may benefit from aspects of the present invention: a flexible IC card, a display device capable of being rolled up, a television, an electric bulletin board, and display for advertising and the like.

According to aspects of the present invention, because a first wiring group is harder than a second wiring group, and the second wiring group bends relatively more readily and to a larger degree than the first wiring group, it is possible to provide a circuit substrate that is easy to roll up yet difficult to bend in a direction perpendicular to the direction of rolling, therefore having a flexibility that is easy to use.

Moreover, according to aspects of the present invention, since the second wiring group is less rigid than the first wiring group, the stress in the bent state to the device is reduced. Therefore, a circuit substrate with high reliability and resistance to breakage of internal components can be provided.

General Aspects of Invention

First, before the explanation of each embodiment, the various principles of a circuit substrate according to the present invention are described. As shown in FIG. 1a, the circuit substrate of aspects of the present invention includes, on a flexible substrate B, a first wiring group L1 extending in a first direction D1 and a second wiring group L2 extending in a second direction D2 substantially orthogonal to the first direction D1. In addition, in an explanation including the following embodiment, merely "substrate" refers to a substrate body excluding the wiring, and the "circuit substrate" refers to a substrate including the wiring.

In one example, substrate B may include a thin plate member that is flexible, hereinafter referred to as a flexible substrate. More specifically, in this example, the substrate may be a film-type substrate formed by a non-woven fabric or various resins. Its flexibility may be associated with a product specification, insulation for forming an electric wiring, and durability. For example, a polyimide film cut in a desired shape may be used.

The first wiring group L1 is a bundle of a wiring 1n1 lined substantially in parallel along the first direction D1, and the second wiring group L2 is a bundle of a wiring 1n2 lined substantially in parallel along the second direction D2. The first direction D1 and the second direction D2 are substantially orthogonal. It is appreciated that both wirings do not have to be exactly in perpendicular. Nonetheless, it is preferable that the both wiring are close to perpendicular, in order to provide anisotropy in the flexibility of the circuit substrate. Both wiring groups do not have to be electrically isolated from each other. Rather, for instance, they may be coupled to each other in any of the portion. Further, the wiring 1n1 and the wiring 1n2 do not have to be different wirings. Rather, they may be combined so as to extend in both the first direction D1 and the second direction D2 by one wiring bending substantially perpendicular to the other wiring.

To attain the effect of aspects of the present invention, a difference is desired between the comprehensive hardness of the first wiring group L1 (being higher) than the comprehensive hardness of the second wiring group L2 (being lower). In short, the first wiring group L1 is formed harder than the second wiring group L2.

Figure 1B:
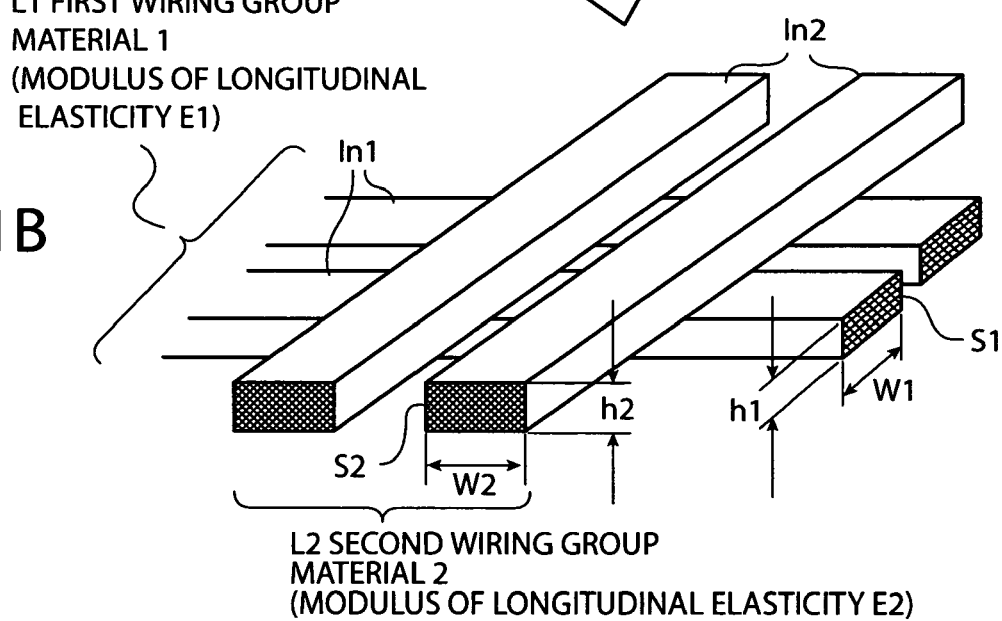
FIG. 1b is a partial enlarged view of a wiring.

FIG. 1b shows a schematic perspective view of the wiring. One or more of the following may differentiate the hardness of the first and second wiring groups: the modulus of elasticity of the material forming each wiring group, the width of individual wires, the thickness of individual wires, and the number of the wirings of each wiring group. Where other elements excluding the element of either one of the elements determining the hardness are the same; the magnitude relation of the element determines the difference of the hardness.

In FIG. 1b, in a first example, it is assumed that the first wiring group L1 is formed of a material 1, and the second wiring group L2 is formed of a material 2, wherein the modulus of longitudinal elasticity (Young's modulus) of the material 1 is E1, and the modulus of longitudinal elasticity of the material 2 is E2. If the other conditions are the same (the widths, heights, and spacings remaining the same), the material with larger modulus of elasticity E is harder and difficult to deform.

In a second example, where the width of the wiring 1n1 forming the first wiring group L1 is W1, and the width of the wiring 1n2 constituting the second wiring group L2 is W2, if the other conditions are the same, the material with wider width W is harder and more difficult to deform.

In a third example, where the thickness (height) of the wiring 1n1 forming the first wiring group L1 is h1, and the thickness of the wiring 1n2 forming the second wiring group L2 is h2, if the other conditions are the same, the wiring group having the wiring with thicker thickness h is harder and difficult to deform.

In a fourth example, where the number of the wirings of the wiring 1n1 forming the first wiring group L1 is N1, and the number of the wirings of the wiring 1n2 forming the second wiring group L2 is N2, if the other conditions are the same, the wiring group with a larger number N of wirings is harder and difficult to deform.

Figure 1C:
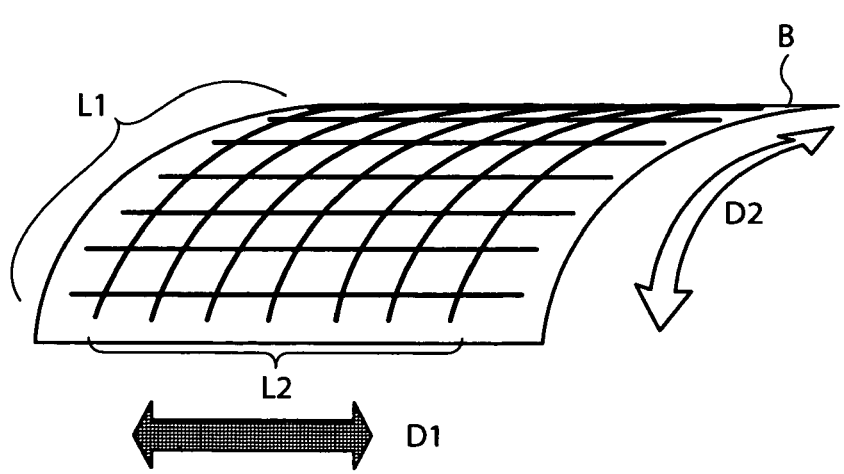
FIG. 1c is a view showing the direction of flexibility.

As for any of each element, the modulus of elasticity (Young's modulus) E, the width W of the wiring, the thickness h (height), or the number N of the wirings, by forming the first wiring group L1 and the second wiring group L2 being different result in a difference in hardness between the wiring groups. This creates an easier bending direction across the circuit substrate as a whole. That is, as shown in FIG. 1c, by designing and forming the first wiring group L1 harder than the second wiring group L2, the circuit substrate as a whole becomes difficult to bend in the direction parallel to the first direction D1, the direction in which the first wiring group L1 extends. On the other hand, the elastic deformation is easier in the direction parallel to the second direction, the direction in which the second wiring group L2 extends. Therefore, the circuit substrate as a whole is the structure capable of curving.

Generally, the following equation (1) relates flexural rigidity D of a bar-like structure, Young's modulus E, and a geometric moment of inertia I.

$$D = EI \qquad \text{Eq. (1)}$$

In the case of the wiring arranged on the substrate, a metal thin film is patterned on the substrate by a photolithography method or the like, thereby creating a cross sectional shape. The shape is preferably a rectangle-like shape (one having a large side in a direction parallel to the substrate surface) but may be of any shape. For instance, as shown in FIG. 1b, the shape can more readily be described as a prism with a width W, a height (or thickness) h, and any shape sides.

Here, when the wiring is a prism having a generally rectangle cross section, the following equation 2 relates a geometric moment of inertia I and the wiring shape.

$$I \propto Wh^3 \qquad \text{Eq. (2)}$$

More specifically, a geometric moment of inertia is proportional to the width W of the wiring, and proportional to the cube of the thickness (height) h of the wiring. As shown in the equations (1) and (2), the hardness of the wiring correlates with the modulus of elasticity, the width of the wiring, and the thickness of the wiring. Also, the hardness of the wiring group correlates with the number of the wirings.

Embodiment 1

Embodiment 1 of the present invention is a flexible electro-optic device capable of being rolled up for easier storage. Embodiment 1 shows a structure that exhibits anisotropic flexing due to changing the material of the wiring. Particularly in the present embodiment, the organic electro luminescence (EL) device, which emits light itself, is exemplified. However, the preset invention is not limited to a light emitting driving method of a pixel unit and other device similar devices. These examples are for the purpose of illustration and not limiting in this regard.

FIG. 2 shows an overall view of an illustrative electro-optic device 1. As shown in FIG. 2a, the electro-optic device 1 of the present embodiment includes a substrate 11 formed with a display region 10 on the surface, a casing 12 for rolling up and storing the substrate 11, and a handle 13 for pulling out the substrate 11. It is appreciated that handle 13 may be removed when the electro-optic device is not intended to be manually rolled and unrolled, but rather controlled by a motor that controls the rolling.

The substrate 11 is a flexible substrate and may be an insulating thin film member, being flexible to an extent that it is capable of rolling up and being stored. The display region 10 displaying an image is formed on substrate 11. The display region 10 is formed by arranging a plurality of pixel units in a matrix form. An electric power circuit for selecting and driving each pixel unit and driver regions 130, 131 for supplying selecting signal and scanning signal are formed on the upper and lower ends of display region 10.

The detailed structure of the display region 10 is explained. As shown in a partial enlarged view of FIG. 2b, a first wiring group 110 running in a first direction D1 in the lateral direction of the figure and a second wiring group 120 running in the longitudinal direction of the figure (a second direction D2), substantially perpendicular to the first direction D1, are formed in the display region 10. Since the described electro-optic device 1 is an organic EL device, the first wiring group 110 running in the lateral direction may be a plurality of scanning line Vsc, and the second wiring group 120 running in the longitudinal direction may be a signal line Vsig and the power line Vp alternatively. A region surrounded by these scanning line Vsc, the power line Vp and the signal line Vsig is the pixel unit 100 that may be referred to as one display unit. The one pixel unit 100 has a light emitting portion 101 and a pixel circuit 102. The light emitting portion 101 has a structure interposing a light emitting layer including the organic EL material between electrodes. The pixel circuit 102 is a drive means formed by a switching element (thin film transistor or the like) that conducts when the scanning line Vsc and the signal line Vsig are in a selected state.

Figure 3:
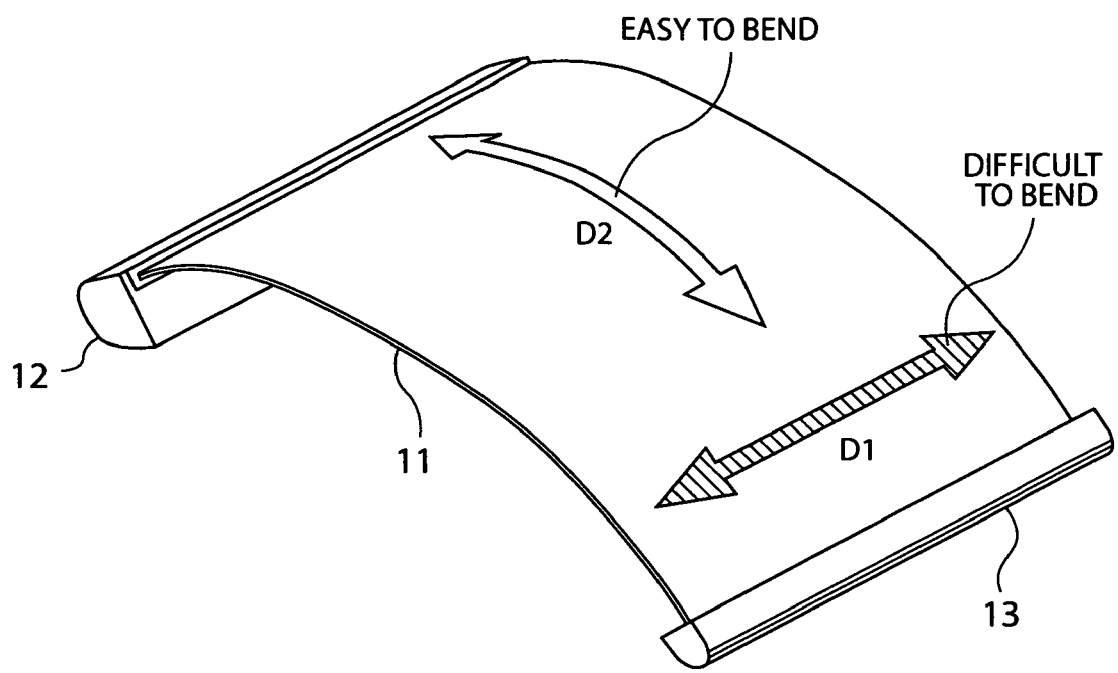
FIG. 3 is an explanatory view of flexibility in a certain direction of a circuit substrate of an embodiment in accordance with aspects of the present invention.

FIG. 3 shows the anisotropy in the flexibility of substrate 11 arranged with the first wiring group 110 arranged in the first direction D1 and the second wiring group 120 arranged in the second direction D2 according to aspects of the present invention. By setting the hardness of the wiring of the second wiring group 120 to bend easier than the first wiring group 110, one may obtain a circuit substrate that is difficult to bend in a direction parallel to the first direction D1 and easier to bend in a direction parallel to the second direction D2, that is, in a curving direction for rolling up.

Figure 4:
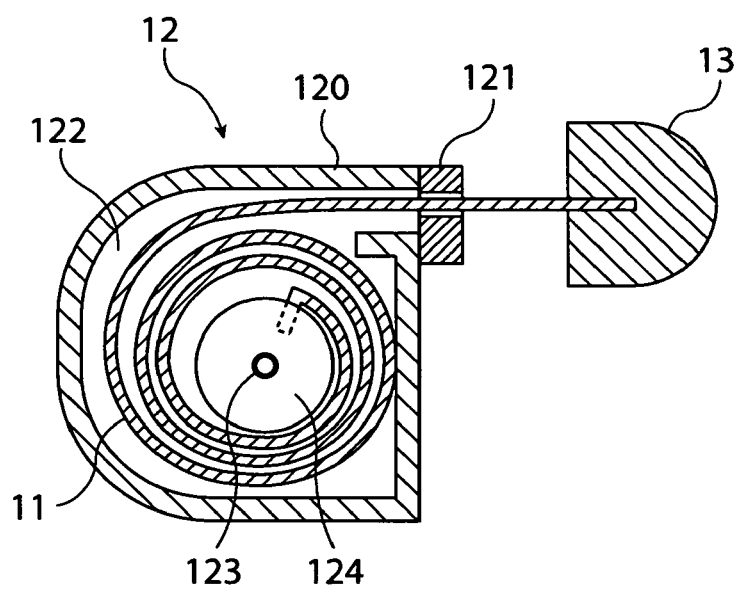
FIG. 4 is a sectional view when storing a circuit substrate in an electro-optic device of the embodiment in accordance with aspects of the present invention.

FIG. 4 shows casing 12 for storing the device. FIG. 4 shows a housing 120 provided with a storing space 122 in the inside and a roller 124 rotatable around rotating shaft 123. The radius of roller 124 is at least the radius of curvature that maintains intact the second wiring in the D2 direction. In one portion of the roller 124, the end portion of the substrate 11 is interposed and fixed. When the roller 124 is rotated counterclockwise in FIG. 4, the substrate 11 is rolled up around the roller 124. When the roller is rotated clockwise, the substrate 11 slides out of the housing 120. The roller 124 may have an applied force in a certain direction created by a spring mechanism (not shown). Further, it may rotate counterclockwise by engaging the force (for example, by opening a latch button (not shown)). The opening portion of the housing 120 is provided with a guide member 121 that guides the substrate 11 to the correct position.

In the above-described structure, when the user grasping the handle 13 adds a pulling out force to the substrate 11, the roller 124 rotates clockwise and the substrate 11 is pulled out from the guide member 121. Moreover, when the user opens the latch button (not shown) or engages a motor (not shown), the roller 124 rotates clockwise and the substrate 11 is rolled up by the roller 124.

In the electro-optic device 1 of the present embodiment, the first wiring group 110 and the second wiring group 120 are made of different materials in the display region 10 formed on the substrate 11. For ease of explanation, it is assumed that the other aspects of each set of wirings (for instance, the width and the thickness of each wiring and the number of the wirings per unit area) are the same.

Figure 5:
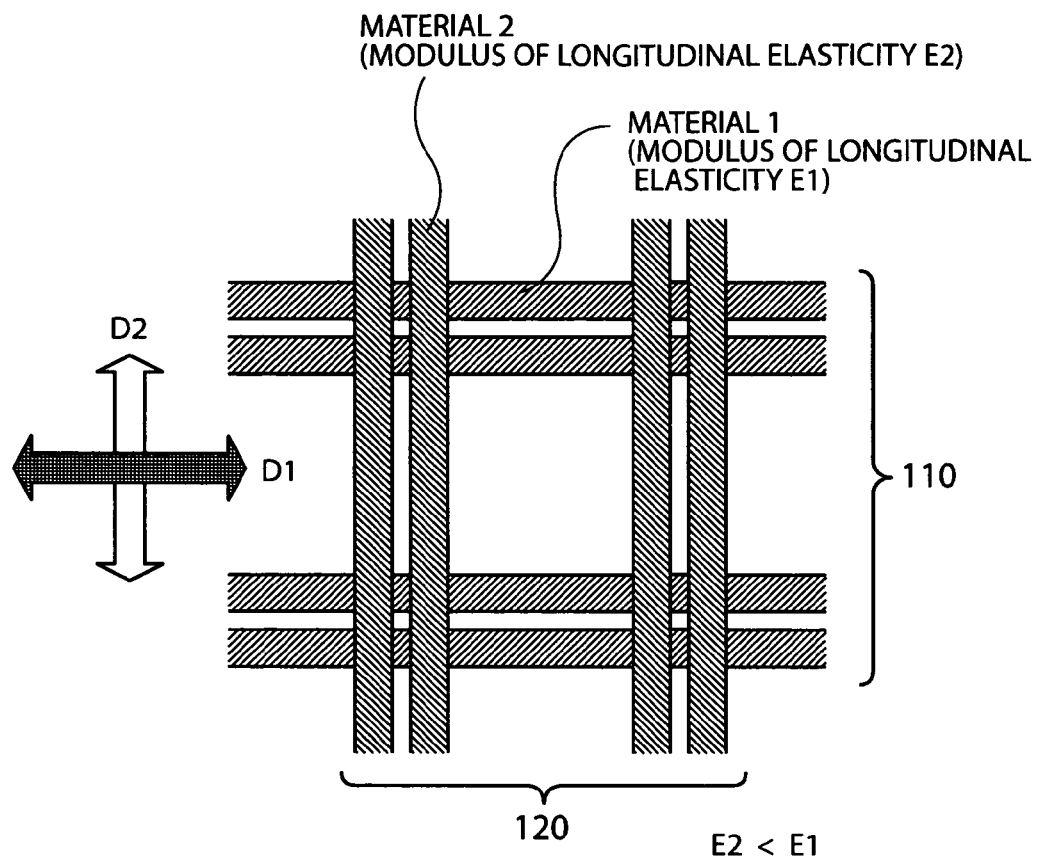
FIG. 5 is an explanatory view of a wiring group differentiated in a material (modulus of elasticity) in embodiment 1 in accordance with aspects of the present invention.

FIG. 5 shows an individual wiring of the first wiring group 110 as formed of a material 1 having a modulus of elasticity E1, and the second wiring group 120 is formed of a material 2 having a modulus of elasticity E2. These materials are selected from, for example, one or more of the materials shown in table 1.

TABLE 1

| Material | Modulus of elasticity (GPa) |
| --- | --- |
| Tantalum (Ta) | 186 |
| Tungsten (W) | 345 |
| Chrome (Cr) | 248 |
| Nickel (Ni) | 207 |
| Aluminum (Al) | 68.3 |
| Copper (Cu) | 110 |

Generally, since the metal material has a level of conductivity, the material is selected concerning the specific resistance or the low cost of the material, easiness of the processing, and the durability and the like. Here, the material may be selected focusing particularly on the size of the modulus of elasticity. As for the metal material of the first wiring group 110, a material with a high modulus of elasticity is selected for the relatively hard material. As for the metal material of the second wiring group 120, a material that is softer than the metal material of the first wiring group 110 with low modulus of elasticity is selected. For example, if chrome is selected as the metal material of the first wiring group 110, nickel, tantalum, copper, aluminum, which have smaller modulus of elasticity than the chrome, may be selected for the metal material of the second wiring group 120.

The difference in the above described modulus of elasticity is, according to the equation (1), reflected on the difference of the flexural rigidity D. The difference in the hardness of the first wiring group 110 and the second wiring group 120 can be made based on this approach.

By patterning each wiring group on the substrate 11 by selecting the material as described above and forming the pixel circuit 102 and the light emitting portion 101, the display region 110 is formed. In such a display region 10, the first wiring group 110 extending in the first direction D1 is harder than the second wiring group 120 extending in the second direction D2 as a whole.

According to the electro-optic device 1 of the above described embodiment 1, since the metal material constituting the thing of the of wiring group is different, the substrate 11 has a structure that is difficult to bend in the direction parallel to the first direction D1, but it is easy to bend in the direction parallel to the second direction D2. Since the second direction D2 is substantially in parallel with the rolling up direction, the substrate 11 is easy to bend when rolling up and difficult to bend in other directions, therefore it is possible to roll up the substrate rapidly and easily.

Moreover, since the second wiring group 120 is not harder than the first wiring group 110, the stress in a bent state can be minimized. Therefore, the display region 10 is hardly damaged when rolled up, the reliability of the electro-optic device itself can be increased, and the duration of the device's life can be increased.

Embodiment 2

Embodiment 2 of the present invention relates to an electro-optic device similar to the above described embodiment 1, and particularly, by changing the thickness (height) of the wiring of the first wiring group and the second wiring group. By changing the thickness of the groups, different hardness levels may be achieved.

Figure 6:
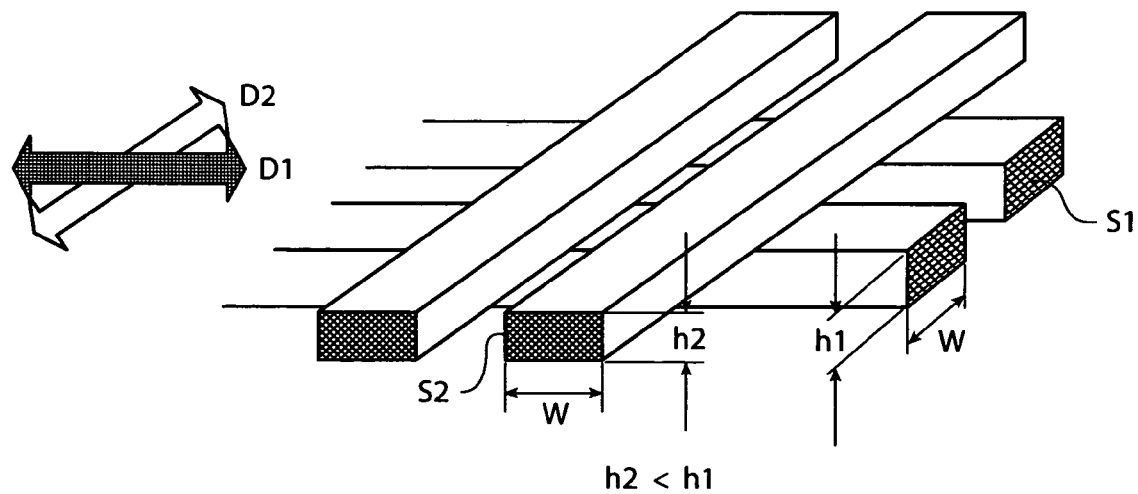
FIG. 6 is an explanatory view of a wiring group differentiated in a thickness of a wiring in embodiment 2 in accordance with aspects of the present invention.

The structure of the electro-optic device 1 of the present embodiment is the same as the embodiment 1; therefore, the explanation thereof is omitted. FIG. 6 shows a schematic perspective view of the wiring according to the present embodiment. In the electro-optic device 1 of the present embodiment, the thickness of each wiring forming the first wiring group 110 and the thickness of the each wiring forming the second wiring group 120 are different in the display region 10 formed on the substrate 11. For ease of explanation, the following explanation is provided assuming that the condition other than the thickness of the wiring, that is, the material constituting each wiring group (modulus of elasticity), the width of each wiring and the number of the wirings are the same.

More specifically, as shown in FIG. 6, the wirings are pattern-formed so the individual wiring of the first wiring group 110 has a thickness h1, and the individual wiring of the second wiring group 120 has a thickness h2. Such difference in the thickness may be achieved by adjusting the thickness of the metal thin film formed on the forming-surface of the wiring material. Specifically, the thickness h1 of the wiring of the first wiring group 110 is formed thicker than the thickness h2 of the wiring of the second wiring group 120.

According to the above described equations (1) and (2), by making a little difference in thickness (thickness of the metal thin film) makes it possible to make a large difference of the flexural rigidity. In other words, a difference of hardness of the first wiring group 110 and the second wiring group 120 creates the different flexing characteristics since the flexural rigidity of the wiring is proportional to the cube of the thickness h.

After forming the metal thin film for each wiring group on the substrate by the thickness as described above, the display region 10 may be formed by patterning such thickness and forming the pixel circuit 102 and the light emitting portion 101. In display region 10, the first wiring group 110 extending in the first direction D1 becomes harder than the second wiring group 120 extending in the first direction D2, as a whole.

Consequently, according to the electro-optic device 1 of embodiment 2, since the thickness of the wiring constituting the wiring group is differentiated, the substrate 11 has a structure that is difficult to bend in the direction parallel to the first direction D1, but easy to bend in the direction parallel to the second direction D2. Since the second direction D2 is substantially in parallel with the rolling up direction, it is easy to bend when rolling up the substrate 11 and difficult to bend in other directions, therefore it is possible to roll up the rapidly and easily with a little force.

Moreover, since the second wiring group 120 is not harder than the first wiring group 110, the stress in a bent state is reduced. Therefore, the display region 10 is hardly damaged if at all even when rolled up, and the reliability of the electro-optic device itself can be made high, and the duration of the device's life can be increased.

Embodiment 3

Embodiment 3 of the present invention relates to the same electro-optic device as the above described Embodiments 1 and 2. In Embodiment 3, the widths of the wiring of the first wiring group and the second wiring group are different, resulting in different hardness values.

The structure of the electro-optic device 1 of the present embodiment is the same as the first embodiment 1, therefore the explanation thereof is omitted.

Figure 7:
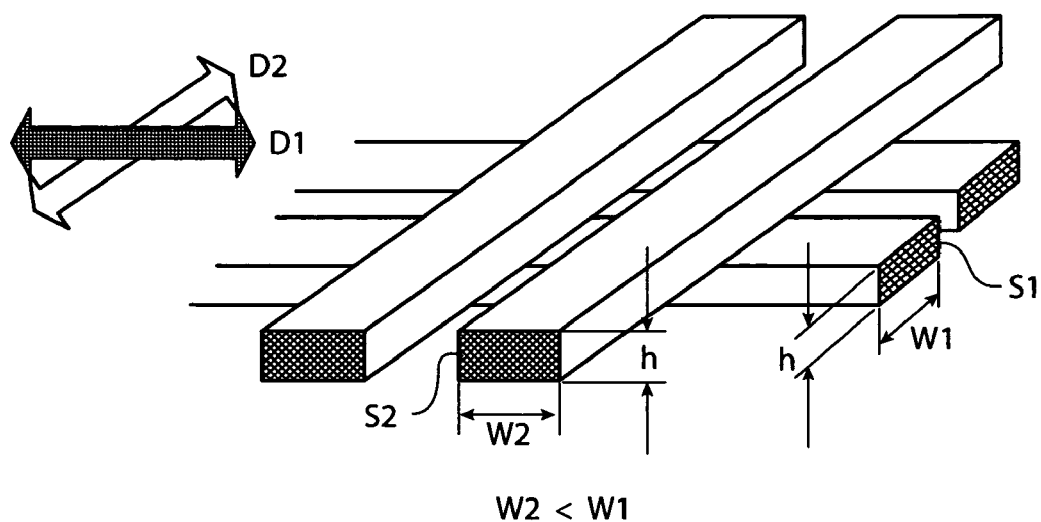
FIG. 7 is an explanatory view of a wiring group differentiated in a width of a wiring in embodiment 3 in accordance with aspects of the present invention.

FIG. 7 shows a schematic perspective view of the wiring according to the present embodiment. In the electro-optic device 1 of the present embodiment, the width of each wiring forming the first wiring group 110 and the width of the each wiring forming the second wiring group 120 is different in the display region 10 formed on the substrate 11.

For ease of explanation, it is assumed that the conditions (other than the width of the wiring) including the type of material, the thickness of each wiring, and the number of the wirings are the same.

More specifically, as shown in FIG. 7, the wiring groups are pattern-formed so as the individual wiring of the first wiring group 110 has a width W1 and the individual wiring of the second wiring group 120 has a width W2. Such difference in width is achieved by changing the width of the wiring formed by, for example, photolithography method. Specifically, the width W1 of the wiring of the first wiring group 110 is formed wider than the width W2 of the wiring of the second wiring group 120.

According to the above described equations (1) and (2), by ensuring different widths for the wiring groups, the difference in the flexural rigidity, that is, the difference of the hardness in the first wiring group 110 and the second wiring group 120, can be made since the flexural rigidity of the wiring is proportional to the width W.

The display region 10 is formed by patterning the wiring groups into the desired widths after forming the metal wiring on the substrate 11, and forming the pixel circuit 102 and the light emitting portion 101. In such a display region 10, the first wiring group 110 extending in the first direction D1 becomes harder than the second wiring group 120 extending in the second direction D2, as a whole.

According to the electro-optic device 1 of the above described embodiment 3, since the width of the wiring constituting the wiring group is differentiated, the substrate 11 has a structure that is difficult to bend in a direction parallel to the first direction D1 and easy to bend in a direction parallel to the second direction D2. Since the second direction D2 is substantially in parallel with the rolling up direction, it becomes easy to bend when rolling up the substrate 11 and difficult to bend in the other directions, therefore it is possible to roll up rapidly and easily with a little force.

Moreover, since the second wiring group 120 is not harder than the first wiring group 110, the stress in a bent state can be reduced. Therefore, the display region 10 is hardly if ever damaged even when rolled up, and the reliability of the electro-optic device itself can be increased, and the duration of the device's life can be increased.

Embodiment 4

Embodiment 4 of the present invention relates to the same electro-optic device of the above described embodiment 1 through 3. In particular, the difference in the hardness is made by changing the wiring number of the first wiring group and the wiring number of the second wiring group.

The structure of the electro-optic device 1 in the present embodiment is the same as embodiment 1; therefore, the explanation thereof is omitted.

Figure 8:
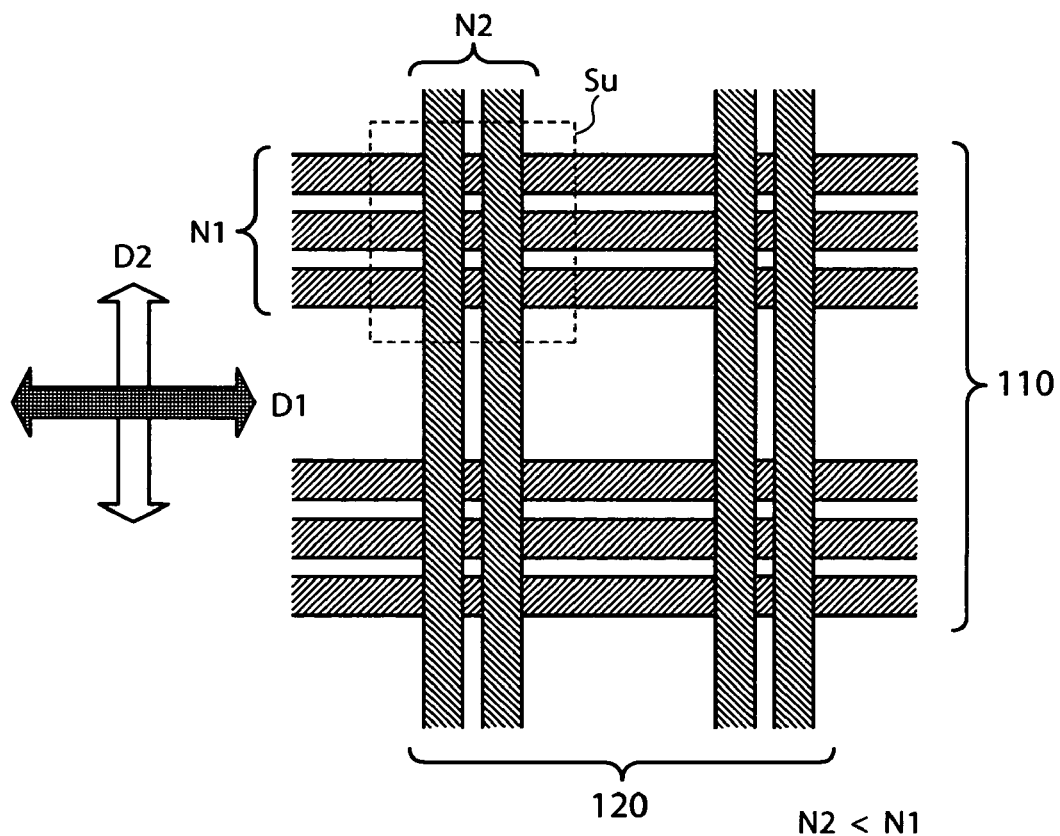
FIG. 8 is an explanatory view of a wiring group differentiated in the number of wirings in embodiment 4 in accordance with aspects of the present invention.

FIG. 8 shows a schematic perspective view of a wiring in the present embodiment. In the electro-optic device 1 of the present embodiment, the number of the wirings forming the first wiring group 110 and the number of the wirings forming the second wiring group 120 is different in the display region 10 formed on the substrate 11. For ease of explanation, the following description assumes that the characteristics other than the number of the wirings (for instance, the width, the thickness and the material of each wiring) are the same.

More specifically, as shown in FIG. 8, the circuit substrate is pattern-formed so as the number of the wirings forming the first wiring group 110 and the number of the wirings forming the second wiring group 120 are represented by N1 and N2, respectively. Such difference in the number of the wirings is achieved by changing the number of the wirings formed by, for example, the photolithography method. Specifically, the number N1 of wirings of the first wiring group 110 is larger than the number N2 of wirings of the second wiring group 120. Accordingly, the difference of the flexural rigidity, that is, the difference of the hardness of the first wiring group 110 and the second wiring group 120 is achieved.

By patterning the wiring group so as to be the above-described number of wiring, after forming the metal thin film of the substrate 11, and forming the pixel circuit 102 and the light emitting portion 101, the display region 10 is formed. In such display region 10, the first wiring group 110 extending in the first direction D1 becomes harder than the second wiring group 120 extending in the second direction D2, as a whole.

According to the electro-optic device 1 of the above described embodiment 4, since the number of the wiring constituting the wiring group is differentiated, the substrate 11 has a structure that is difficult to bend in the direction parallel to the first direction D1, but is easy to bend in the direction parallel to the second direction D2. Since the second direction D2 is substantially in parallel with the rolling up direction, it is easy to bend when rolling up the substrate 11 and is difficult to bend in the other directions; therefore, it is possible to rapidly and easily roll up.

Moreover, since the second wiring group 120 is not as hard as the first wiring group 110, the stress in a bent state can be reduced. Therefore, the display region 10 is hardly damaged if at all even when rolled up, and the reliability of the electro-optic device itself can be increased, and the duration of the device's life can be increased.

OTHER MODIFICATION

The present invention is not limited to the above described embodiments. It may be applied to other instances as well. More specifically, the difference of the hardness of the first wiring group 110 and the second wiring group 120 is not only the difference of the individual physical element, but may be intertwined with a plurality of above described elements. In short, the various ways of modifying hardness described above may be combined to enhance the directional flexibility of the device. Overall, in the size relationship of the flexural rigidity calculated by the above described equations (1) and (2), the hardness difference generates in the first wiring group 110 and the second wiring group 120.

More specifically, as another embodiment, as for the first wiring group 110 and the second wiring group 120, by changing a plurality of elements selected from a group formed by the modulus of elasticity E of the constituent material, the width W of individual wiring, the thickness h of individual wiring, and the number N of the wirings constituting each wiring group, the first wiring group 110 may be made harder than the second wiring group 120. The second wiring group 120 may bends more readily than the first wiring group 110. Therefore, it can be structured so as to be flexible as a whole.

By making the extending direction D2 of the flexible second wiring group 120 substantially in parallel with the rolling up direction, it is possible to provide a highly reliable circuit substrate which is easy to roll up and is hardly damaged if at all with the stress of rolling the device.

Aspects of the present invention have been described in terms of preferred and exemplary embodiments thereof. Numerous other embodiments, modifications and variations within the scope and spirit of the appended claims will occur to persons of ordinary skill in the art from a review of this disclosure.

I claim:

1. A circuit substrate comprising:
    a first wiring group extending in a first direction of the circuit substrate; and
    a second wiring group extending in a second direction of the circuit substrate intersecting with the first direction, the circuit substrate being more flexible along the second direction than along the first direction.

2. The circuit substrate according to claim 1, said circuit substrate being configured to bend more easily in said second direction than in said first direction.

3. The circuit substrate according to claim 1, the first wiring group being formed of a material having a larger modulus of elasticity than a material used to form the second wiring group, resulting in said circuit substrate bending more easily in said second direction than in said first direction.

4. The circuit substrate according to claim 1, a width of each wiring of the first wiring group being formed wider than a width of each wiring of the second wiring group, resulting in said circuit substrate bending more easily in said second direction than in said first direction.

5. The circuit substrate according to claim 1, a thickness of each wiring of the first wiring group being formed thicker than a thickness of each wiring of the second wiring group, resulting in said circuit substrate bending more easily in said second direction than in said first direction.

6. A circuit substrate comprising:
   a first wiring group extending in a first direction of the circuit substrate; and
   a second wiring group extending in a second direction of the circuit substrate intersecting with the first direction,
   the number of wirings forming the first wiring group being more than the number of wirings forming the second wiring group, and the second wiring group bending more easily than the first wiring group.

7. The circuit substrate according to claim 6, said circuit substrate being configured to bend in the second direction more easily than in said first direction.

8. A circuit substrate comprising:
   a first wiring group extending in a first direction of the circuit substrate; and
   a second wiring group extending in a second direction of the circuit substrate intersecting with the first direction,
   as for the first wiring group and the second wiring group,
   a flexibility along the first direction being different from a flexibility along the second direction based on changing one or more characteristics selected from a group including a modulus of elasticity, a width of a wiring, a thickness of a wiring, and the number of wirings forming each wiring group.

9. The circuit substrate according to claim 8, at least two of said characteristics between said first wiring group and said second wire group being different.

10. The circuit substrate according to claim 8, at least three of said characteristics between said first wiring group and said second wiring group being different.

11. The circuit substrate according to claim 8, four of said characteristics differing between said first wiring group and said second wiring group.

12. The circuit substrate according to claim 8, the second wiring group being configured to flex more easily than the first wiring group.

13. The circuit substrate according to claim 12, a flexibility of the second wiring group resulting in said circuit substrate being more flexible.

14. The circuit substrate according to claim 1, said circuit substrate comprising part of an electro-optic device.

15. The circuit substrate according to claim 6, said circuit substrate comprising part of an electro-optic device.

16. The circuit substrate according to claim 8, said circuit substrate comprising part of an electro-optic device.

17. The circuit substrate according to claim 1, said circuit substrate comprising part of electronic equipment.

18. The circuit substrate according to claim 6, said circuit substrate comprising part of electronic equipment.

19. The circuit substrate according to claim 8, said circuit substrate comprising part of electronic equipment.

* * * * *